United States Patent [19]

Yokoyama et al.

[11] 4,064,289
[45] Dec. 20, 1977

[54] METHOD OF MAKING A SEMICONDUCTOR DEVICE

[75] Inventors: Takashi Yokoyama; Yasuo Miyadera; Nobuhiko Shito; Hiroshi Suzuki, all of Hitachi; Yoshiaki Wakashima, Kawasaki, all of Japan

[73] Assignee: Hitachi, Ltd., Tokyo, Japan

[21] Appl. No.: 606,354

[22] Filed: Aug. 21, 1975

[30] Foreign Application Priority Data

Aug. 21, 1974 Japan .................... 49-95015

[51] Int. Cl.² ........................... H01L 23/30
[52] U.S. Cl. ........................ 427/82; 427/88; 427/226; 427/385 R; 29/588; 29/577 R; 29/590; 260/49; 428/474
[58] Field of Search ........... 427/82, 385 R, 88, 226; 428/474; 29/588, 577, 590; 260/49

[56] References Cited

U.S. PATENT DOCUMENTS

| 3,128,203 | 4/1964 | Dahlberg | 427/82 |
| 3,682,698 | 8/1972 | Palmer et al. | 427/82 |
| 3,868,351 | 2/1975 | Hand et al. | 428/474 |

FOREIGN PATENT DOCUMENTS 2,014,840 10/1970 Germany ................ 427/82

Primary Examiner—Ralph S. Kendall
Assistant Examiner—John D. Smith
Attorney, Agent, or Firm—Beall & Jeffery

[57] ABSTRACT

Method of making a semiconductor device which includes applying a solution of a heterocyclic ring-containing polymer in an organic solvent to a desired surface of a semiconductor body and removing the organic solvent from the solution by heat thereby to form a coating of a polymer on the surface, wherein the polymer is a reaction product of a diamine represented by the formula:

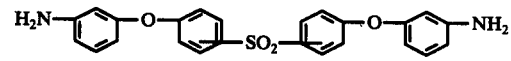

with a tetracarboxylic acid or anhydride of it. Since the coating exhibits good thermal stability and good electrical properties when applied to the surface of the semiconductor, it is useful as a passivating film.

7 Claims, No Drawings

METHOD OF MAKING A SEMICONDUCTOR DEVICE

BACKGROUND OF THE INVENTION

This invention relates to a method of making a semiconductor device, especially to a method of forming a film of a resin on the surface of a semiconductor body for stabilizing the surface of the semiconductor device.

Heretofore, a silicon dioxide film has been most frequently used for passivating p-n junctions of a semiconductor element.

A relatively thick silicon dioxide film is required for attaining the above property, however, it is difficult to form films of the required thickness because a length of time required for forming them. Moreover, even if a film of required thickness is obtained, cracks inherently appear in the film owing to the differences of expansion coefficients between silicon and silicon dioxide.

In order to obtain the silicon dioxide film, a silicon body has to be heated at a temperature of about 1000° to 1200° C, and hence the use of a heat source of a large scale and other equipment are indispensable. Other methods for forming a silicon dioxide film at relatively low temperatures have been proposed such as a Chemical Vapor Deposition method (CVD method) or sputtering method. But, films of uneven thickness or porous films are likely to be obtained by these methods.

For overcoming these defects as mentioned above, silicone rubbers or silicone resins are utilized for forming a film for stabilizing a surface of a semiconductor body. By using these materials, a film with a high voltage resistance and with a large thickness, e.g., up to about 100μ or more, may be obtained at a relatively low treatment temperature. However the leakage resistance of such films is small, and the heat resistance, adhesion, and thermal shock resistance of the films are generally insufficient.

For these reasons, silicone rubber or silicone resin films are not applied for a semiconductor device requiring a high efficiency.

Recently, the use of a film of polyimide resin or polyamideimide resin with good electric properties has been proposed. For forming films of these resins, a semiconductor body has to be heated to a relatively high temperature, e.g., about 250° C or above, which damages electrodes or leadwires when electrodes or leadwires are previously fitted, or which requires additional complicated steps such as photoetching when electrodes or leadwires are fitted as a final stage.

An object of the invention is to provide a method of making a semiconductor device with a fewer steps.

Another object of the present invention is to provide a method of making a semiconductor device suitable for mass production.

A further object of the present invention is to provide a method for forming a film for stabilizing the surface of a semiconductor body at a relatively low temperature.

A further object of the present invention is to provide a method of making a semiconductor device using an improved coating material of high thermal shock resistance and moisture resistance.

A further object of the present invention is to provide a method of making a semiconductor device using an improved coating material which is suitable for increasing the surface stability of a semiconductor body.

SUMMARY OF THE INVENTION

One feature of the present invention is to use an organic solvent-soluble heterocyclic ring-containing polymer in a step of coating a surface of semiconductor body for stabilizing the same. The functional groups of the heterocyclic ring-containing polymer are substantially closed to form heterocyclic rings in the polymer before the solution is applied to the surface.

To be more specific, a method of the present invention comprises coating the surface of the semiconductor device with a solution of a heterocyclic ring-containing polymer in an organic solvent, and removing the organic solvent by heating the semiconductor body coated with the solution.

DESCRIPTION OF A PREFERRED EMBODIMENT

Examples of the heterocyclic containing polymers used in the present invention are polyhydantoin, polyesterhydantoin, polyamidehydantoin, polyesterimidehydantoin, polyamideimidehydantoin, polyesterimide, polyimidehydantoin, and polyimide resins obtained by the reaction product of a diamine component including as an indispensable ingredient an aromatic diamine compound represented by the following general formula:

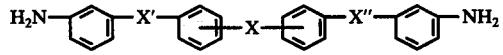

wherein X, X', X" are selected from the group consisting of O, $SO_2$, $CH_2$, COO, S, CO, and $C(CH_3)_2$, with a tetracarboxylic acid or one of its derivatives at a temperature of 80° C or above in the presence or absence of an organic solvent.

Examples of the aromatic diamine compound represented by the above general formula are 4,4'-di(m-aminophenoxy)diphenylsulfone, 4,4'-di(m-aminophenoxy)-diphenylether, 4,4'-di(m-aminophenoxy)diphenylpropane, 4,4'-di(m-aminophenylsulfonyl)diphenylether and 4,4'-di(m-aminophenylthioether)diphenylsulfide.

A common characteristic of these aromatic diamine compounds is that two amino radicals are located in meta-position, and it is considered that the above characteristic contributes to the solubility of the reaction product in the organic solvent.

One or more of the following ordinary diamines may be added to the above described aromatic diamine.

4,4'-diaminodiphenylether, 4,4'-diaminodiphenylmethane, 4,4'-diaminodiphenylsulfone, 3,3'-diaminodiphenylsulfone, metaphenylenediamine, orthophenylene diamine, paraphenylenediamine, 4,4'-diaminodiphenylpropane, 4,4'-diaminodiphenylsulfide, 1,5-diaminonaphthalene, 2,6-diaminonaphthalene, 2,6-diaminopyridine, 4,4'-di(p-aminobenzoyl)diphenylether, 4,4'-di(p-aminophenoxy) diphenylsulfone, 1,4-di(p-aminophenoxy)benzene, 1,3-di(p-aminophenoxy) benzene and 4,4'-di(o-aminophenoxy)diphenylsulfone.

Examples of the tetracarboxylic acid and its derivatives are 3,3',4,4'-benzophenonetetracarboxylic acid, 4,4'-sulfonyldiphthalic acid, 3,3',4,4'-diphenylethertetracarboxylic acid, cyclopentanetetracarboxylic acid, butanetetracarboxylic acid, ethylenebistrimellitate, and anhydrides, diesters, tetraesters and diester dihalides of these tetracarboxylic acids.

One or more of the following tetracarboxylic acids may be added to the above mentioned tetracarboxylic acid and its derivatives, pyromellitic acid, 3,3',4,4'-diphenyltetracarboxylic acid, 2,3,6,7-naphthalenetetracarboxylic acid, 1,4,5,8-naphthalenetetracarboxylic acid, and 3,4,9,10-perylenetetracarboxylic acid. It will be noted that when a tetracarboxylic acid of this latter mentioned group is used alone, the reaction products are insoluble in the organic solvent.

The aromatic diamine compound is preferably reacted with an equimolar amount of the tetracarboxylic acid or its derivatives, and the reaction temperature thereof is preferably 80° C or above. The upper limit of the reaction temperature is not restricted, but too high a reaction temperature results in the need for uneconomical processing of the device.

When the reaction is conducted in an organic solvent, the following organic solvents exemplify those which may be employed; cresol, nitrobenzene, phenol, sulfolane methylsulfolane, dimethylsulfoxide, xylenol, N-methyl-2-pyrrolidone, N,N-dimethylacetamide, N,N-dimethylformamide and hexamethylphosphoramide.

Further, toluene and xylene may be preferably added to the solvent so as to remove water produced through the reaction by azeotropic distillation.

The following examples illustrate the synthesis of an organic solvent soluble polyimide resin obtained by reacting an aromatic diamine represented by the above general formula with a tetracarboxylic acid or one of its derivatives.

EXAMPLE 1

A 100-cc capacity 4-neck flask equipped with a thermometer, an agitator, nitrogen gas-introducing tube and a Liebig condenser was charged with 4.32 g of 4,4'-di-(m-aminophenoxy)diphenylsulfone, 3.22 g of 3,3',4,4'-benzophenone tetracarboxylic dianhydride, 60 g of cresol and 10 g of xylene. The charges of the flask were agitated and the temperature was elevated while passing nitrogen gas through the flask. When the temperature was elevated to about 100° C, the reactants were completely dissolved and discharge of water formed by the reaction was initiated. The reaction was conducted at 140° C for 5 hours.

EXAMPLE 2

The procedure of Example 1 was followed except that the flask was charged with 4.32 g of 4,4'-di(m-aminophenoxy)diphenylsulfone, 60 g of cresol, 10 g of xylene and 3.10 g of 3,3',4,4'-diphenylether tetracarboxylic dianhydride, and the reaction was conducted at 140° C for 6 hours.

EXAMPLE 3

The procedure of Example 1 was followed except that the flask was charged with 4.32 g of 4,4'-di(m-aminophenoxy)diphenylsulfone, 4.10 g of ethylene-bis-trimellitate anhydride, 60 g of cresol and 10 g of xylene, and the reaction was conducted at 140° C for 6 hours.

EXAMPLE 4

The procedure of Example 1 was followed except that sulfolane was used instead of cresol. The reaction was conducted at 140° C for 5 hours.

EXAMPLE 5

The procedure of Example 1 was followed except that the flask was charged with 4.32 g of 4,4'-di(m-aminophenoxy)diphenylsulfone, 2.576 g of 3,3',4,4'-benzophenone tetracarboxylic dianhydride, 0.436 g of pyromellitic dianhydride, 60 g of cresol and 10 g of xylene, and the reaction was conducted at 140° C for 6 hours.

EXAMPLE 6

The procedure of Example 1 was followed except that the flask was charged with 4,4'-di(m-aminophenoxy) diphenylsulfone and 0.4 g of 4,4'-diaminodiphenylether, 3.22 g of 3,3',4,4'-benzophenone tetracarboxylic dianhydride, 60 g of cresol and 10 g of xylene. The reaction was conducted at 140° C for 5 hours.

EXAMPLE 7

The procedure of Example 1 was followed except that the flask was charged with 3.84 g of 4,4'-di(m-aminophenoxy)diphenylether, 3.22 g of 3,3',4,4'-benzophenone tetracarboxylic dianhydride, 60 g of N-methyl-2-pyrrolidone and 10 g of toluene. The reaction was conducted at 140° C for 6 hours.

In the present invention, the heterocyclic ring-containing polymer above mentioned is usually diluted with an organic solvent.

Since the reaction products formed in the above Examples are obtained in an organic solvent, the reaction produces solution may be used for coating the surface of a semiconductor body as they are formed, or they may be further diluted with another organic solvent to solid concentrations of 5 to 10% by weight.

Substantially any organic solvent may be used for dilution of the heterocyclic ring-containing polymers except for solvents containing large quantities of non volatile impurities. Examples of the suitable organic solvents include cresol, N-methyl-2-pyrrolidone, sulfolane, nitrobenzene, phenol, methylsulforane, dimethylsulfoxide, xylenol, N,N-dimethylacetamide, N,N-dimethylformamide and hexamethylphosphoramide.

In the present invention, after coating at least a portion of the p-n junctions of a semiconductor device with a solution of the heterocyclic ring-containing polymer in an organic solvent, a film for stabilizing the surface of the semiconductor device is obtained by heating the semiconductor device at a relatively low temperature to drive off the organic solvent from the solution, namely at a temperature lower than 250° C, preferably 150° to 200° C. When a heating temperature below 150° C is selected, the time for driving off the organic solvent is extended. When a heating temperature of 200° to 250° is selected, the adhesive property of the film to the surface of the semiconductor is improved by the hot melt effect, however, heating at the elevated temperatures has to be controlled to avoid deteriorating the film properties.

An example of a method of making a semiconductor device which is provided with a stabilizing film in accordance with the present invention will be explained hereinafter.

EXAMPLE 8

At first, electrodes of Al, Au, Ag, Ni, or alloys thereof and leadwire of Fe, Cu, Ni, Sn, Au, Al, or alloys thereof are fixed on the surface of a semiconductor body. The semiconductor body, along with its electrodes or leadwires, is then subjected to a cleaning treatment wherein the surface is washed with an organic solvent such as acetone. After the entire surface of the semiconductor device is cleaned, an organic solvent solution of a heterocyclic ring-containing polymer is brushed thereon for forming a layer of solution. Alternatively, the entire surface of the semiconductor body is dipped into a solution of the polymer for forming a layer of the solution. The semiconductor device covered with the layer of polymer solution is heated in an oven at 200° C for 4 hours, at 175° C for 8 hours, or 150° C for 16 hours for removing the solvent from the layer.

EXAMPLES 9–23

The Table 1 shows the contents and their properties of 15 suitable examples of solutions that can be used for obtaining semiconductor bodies in accordance with method of the present invention. The polyimidesulfone shown in examples 17 to 23 is the reaction product of 4,4'-di(m-aminophenoxy) diphenylsolfone with 3,3',4,4'-benzophenone tetracarboxylic dianhydride.

EXAMPLES 24–38

Fifteen mesa-type diodes having a break down voltage of 800V, complete with electrodes and leadwires were prepared. After the diodes were subjected to a cleaning treatment with an organic solvent such as acetone, the diodes were coated respectively with the solution of examples 9 to 23 by being dipped. The diodes were heated at 150° C for 16 hours.

The Table 2 shows the leakage current of the respective diodes at temperatures 100° C, 125° C, 150° C with applied DC voltage of 300V. The leakage currents of the respective diodes were measured using the fifteen solutions shown in Table 1. Table 2 shows that the leakage current of the semiconductor devices made according to the method of the present invention is small.

TABLE "2"

| Leakage Current Characteristics of Semiconductor Device (as measured at a direct current voltage of 300V) | | | |
|---|---|---|---|
| Solution of Example | Leakage Current Value (μA) | | |
| | 100° C | 125° C | 150° C |
| Example 24 | 9 | 2 | 3 | 6 |
| Example 25 | 10 | 1 | 3 | 4 |
| Example 26 | 11 | 3 | 6 | 12 |
| Example 27 | 12 | 5 | 8 | 15 |
| Example 28 | 13 | 2 | 4 | 9 |
| Example 29 | 14 | 6 | 8 | 15 |
| Example 30 | 15 | 2 | 4 | 7 |
| Example 31 | 16 | 4 | 5 | 11 |
| Example 32 | 17 | 2 | 8 | 14 |
| Example 33 | 18 | 4 | 6 | 8 |
| Example 34 | 19 | 9 | 15 | 26 |
| Example 35 | 20 | 8 | 10 | 18 |
| Example 36 | 21 | 8 | 9 | 14 |
| Example 37 | 22 | 5 | 6 | 18 |
| Example 38 | 23 | 5 | 6 | 16 |

What we claim is:

1. A method of making a semiconductor device in which a desired surface of a pn-junction of a semiconductor body is coated with a polyimide resin, which comprises:
   applying a solution of the polyimide resin in an organic solvent onto the surface; and
   removing the solvent from the solution by heating to form a coating of the resin on the surface, wherein the polyimide resin is a heterocyclic ring-containing polymer that is a reaction product at 80° C or above of a diamine represented by the formula:

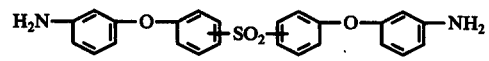

with a tetracarboxylic acid, the heterocyclic rings of the polymer being substantially closed in the solution.

2. A method of making a semiconductor device according to claim 1, wherein the solution contains the heterocyclic ring-containing polymer in an amount of 5 to 10% by weight.

TABLE "1"

| | Kind of Polymer | Organic Solvent | Resin Concentration (% by weight) | Viscosity (poise) of Varnish | Diluent | Non-Volatile Component Content (% by weight) of Solution Actually Coated |
|---|---|---|---|---|---|---|
| Example 9 | polyester imide hydantoin | cresol | 27 | 135 | cresol | 8 |
| Example 10 | polyamide imide hydantoin | N-methyl-2-pyrrolidone | 20 | 250 | " | 7 |
| Example 11 | polyester imide | cresol | 30 | 580 | " | 6 |
| Example 12 | polyhydantoin | " | 30 | 2300 | N-methyl-2 pyrrolidone | 5 |
| Example 13 | polyimide hydantoin | " | 15 | 120 | — | 15 |
| Example 14 | polyester hydantoin | " | 30 | 160 | sulfolane | 8 |
| Example 15 | polyamide hydantoin | " | 30 | 180 | cresol | 7 |
| Example 16 | polyesteramide imide hydantoin | " | 21 | 30 | " | 10 |
| Example 17 | polyimide sulfolane | " | 11 | 10 | — | 11 |
| Example 18 | " | " | 11 | 15 | sulfolane | 10 |
| Example 19 | " | " | 12 | 20 | N-methyl-2-pyrrolidone | 10 |
| Example 20 | " | sulfolane | 11 | 300 | cresol | 7 |
| Example 21 | " | cresol | 10 | 35 | — | 10 |
| Example 22 | " | " | 10 | 40 | — | 10 |
| Example 23 | " | N-methyl-2-pyrrolidone | 10 | 50 | — | 10 |

3. A method of making a semiconductor device according to claim 1, wherein the solvent is selected from the group consisting of cresol, nitrobenzene, phenol, sulfolane, methylsulfolane, dimethylacetamide, N,N-dimethylformamide, and hexamethylphosphor amine.

4. A method of making a semiconductor device according to claim 1, including the step of attaching electrical leads to said semiconductor body at least prior to said steps of coating and removing.

5. A method of making a semiconductor device according to claim 1, wherein the heterocyclic ring-containing polymer is a polyimide obtained by the reaction of 4,4'-di(m-aminophenoxy) diphenylsulfone with a tetracarboxylic acid at a temperature of 80° C or above.

6. A method of making a semiconductor device according to claim 1, wherein the tetracarboxylic acid is at least one member selected from the group consisting of 3,3',4,4'-benzophenonetetracarboxylic acid; 4,4'-sulfonyldiphthalic acid; 3,3',4,4'-diphenylethertetracarboxylic acid; cyclopentanetetracarboxylic acid; butanetetracarboxylic acid; ethylenebistrimellitate and the anhydrides, diesters, tetraesters and diester dihalides thereof.

7. A method of making a semiconductor device according to claim 6, wherein the tetracarboxylic acid is further mixed with a member selected from the group consisting of 3,3',4,4'-diphenyltetracarboxylic acid; 2,3,6,7-naphthalenetetracarboxylic acid; 1,4,5,8-naphthalenetetracarboxylic acid; 3,4,9,10perylenetetracarboxylic acid; and anhydrides, diesters, tetraesters and diester dihalides thereof.

* * * * *